United States Patent [19]

Gates, Jr. et al.

[11] Patent Number: 5,311,401

[45] Date of Patent: May 10, 1994

[54] STACKED CHIP ASSEMBLY AND MANUFACTURING METHOD THEREFOR

[75] Inventors: Louis E. Gates, Jr., Westlake Village; Richard K. Cochran, Ingelwood, both of Calif.

[73] Assignee: Hughes Aircraft Company, Los Angeles, Calif.

[21] Appl. No.: 727,500

[22] Filed: Jul. 9, 1991

[51] Int. Cl.$^5$ .............................................. H05K 7/02
[52] U.S. Cl. .................... 361/760; 361/744; 361/748; 361/772; 361/777; 361/813; 174/255; 257/686
[58] Field of Search ............... 361/396, 397, 400, 401, 361/404, 421, 735, 744, 748, 760, 761, 772, 775, 777, 807, 813, 792; 357/65, 70, 71; 174/255, 260; 257/686, 690, 700, 786

[56] References Cited

U.S. PATENT DOCUMENTS 4,567,643 2/1986 Droguet et al. ...................... 29/575

Primary Examiner—Leo P. Picard
Assistant Examiner—Young Whang
Attorney, Agent, or Firm—L. A. Alkov; W. K. Denson-Low

[57] ABSTRACT

Two or more integrated circuit or memory chips (64–66, 104, 106–108, 116–118, 122–126) are stacked on a circuit substrate (72, 100) or a printed-wiring board in such a manner that the planes of the chips lie horizontally, rather than vertically, on the substrate or wiring board. The chips are preferably interconnected along all of their edges (68) and thence, preferably by ribbon bonds, to the substrate or wiring board. The thus assembled arrangement is hermetically sealed by coatings of passivation and encapsulant. Such chips (25) are oversized, as distinguished from chips conventionally diced from wafers. Specifically, each chip is larger than an individual wafer circuit (18, 20), that is, each wafer portion (24) which is selected to be formed into a chip has a size that is larger than the individual wafer circuit which it incorporates, thus overlapping adjacent circuits.

5 Claims, 5 Drawing Sheets

STACKED CHIP ASSEMBLY AND MANUFACTURING METHOD THEREFOR

BACKGROUND OF THE INVENTION

1. Field of the Invention

The present invention relates to a method for fabricating and assembling integrated circuit or memory chips on a circuit substrate or printed wiring board and, more particularly, for stacking such chips into a contacting layered stack, such that their planes lie parallel to and in contact-with the plane of the circuit substrate or printed wiring board, and to the parallelly stacked chip assembly manufactured by the method.

2. Description of Related Art and Other Considerations

Conventionally, integrated circuit and memory chips are mounted singly in a hermetic package, and the package leads are interconnected to a substrate or a printed circuit board. Alternately, the chips are mounted onto a circuit board in a hermetic hybrid package whose external leads are interconnected to the printed wiring board.

When space and volume are at a premium, use of such conventional mounting arrangements results in a less than optimal overall circuit density and a lower circuit speed. Specifically, presently used mounting arrangements consume relatively large amounts of space and volume, and thus lessen circuit density. Further, the relatively large spacing between the chips lowers circuit speed and increases capacitances, thereby causing slower signal propagation through the circuit.

These problems have been recognized in the packaging technology, as exemplified by U.S. Pat. No. 4,525,921 and 4,764,846. There, chips are stacked at right angles to the substrate and interconnected with edge metalizing circuitry. On one edge or face of the stack, the circuit lines terminate at metal bumps which are used to interconnect the stack directly to a substrate and its corresponding pattern of circuit pads. The chips are thus oriented so that their planes lie normal to the plane of the substrate.

The aim of these patents is to achieve a high density in the stack. However, as disclosed, for example, in U.S. Pat. No. 4,764,846, to enable the mounting of its individual chips and their carriers to a stack-carrying substrate, the leads from the chips must be extended to a single side, which consumes a relatively large area, thereby militating against the desired aim of high density.

It is also possible further to increase density by lapping material from the back side of the wafer prior to its being diced into thinned chips. This thinning is expensive, and adds to the cost of the stack.

The bump mounting method of the stack is also costly, and its use in producing reliable connections is uncertain for use in such environments as airborne systems.

SUMMARY OF THE INVENTION

The present invention overcomes these and other problems and provides for a still higher density over such above described conventional methods by stacking two or more integrated circuit or memory chips on a circuit substrate or printed wiring board in such a manner that the planes of the chips are parallelly, rather than normally, oriented to the substrate or wiring board. The chips can be interconnected as desired, not only from one edge, but also about their entire periphery and thence, preferably by ribbon bonds, to the substrate or wiring board. The thus assembled arrangement is hermetically sealed by coatings of passivation and encapsulant.

Such chips are oversized, as distinguished from chips conventionally diced from wafers. Specifically, each chip is larger than an individual wafer circuit, that is, each wafer portion which is selected to be formed into a chip has a size that is larger than the individual wafer circuit which it incorporates, thus overlapping adjacent circuits.

Several advantages are derived from this arrangement. As compared to conventional designs, overall circuit density is further increased by holding the space and volume used to a minimum, by a factor, for example, of about five times over that disclosed in above discussed U.S. Pat. No. 4,764,846. Because the spacing between the chips is minimized, circuit speed is increased and line impedance and capacitance is correspondingly lowered, thereby permitting higher signal propagation rates through the circuit. The cost of fabrication is lowered and the use of bump mounting is avoided, thus resulting in reliable interconnections. Thermal dissipation is improved. Special hermetic packaging may be avoided, if desired.

Other aims and advantages, as well as a more complete understanding of the present invention, will appear from the following explanation of exemplary embodiments and the accompanying drawings thereof.

DETAILED DESCRIPTION OF THE PREFERRED EMBODIMENTS

Figure 1:
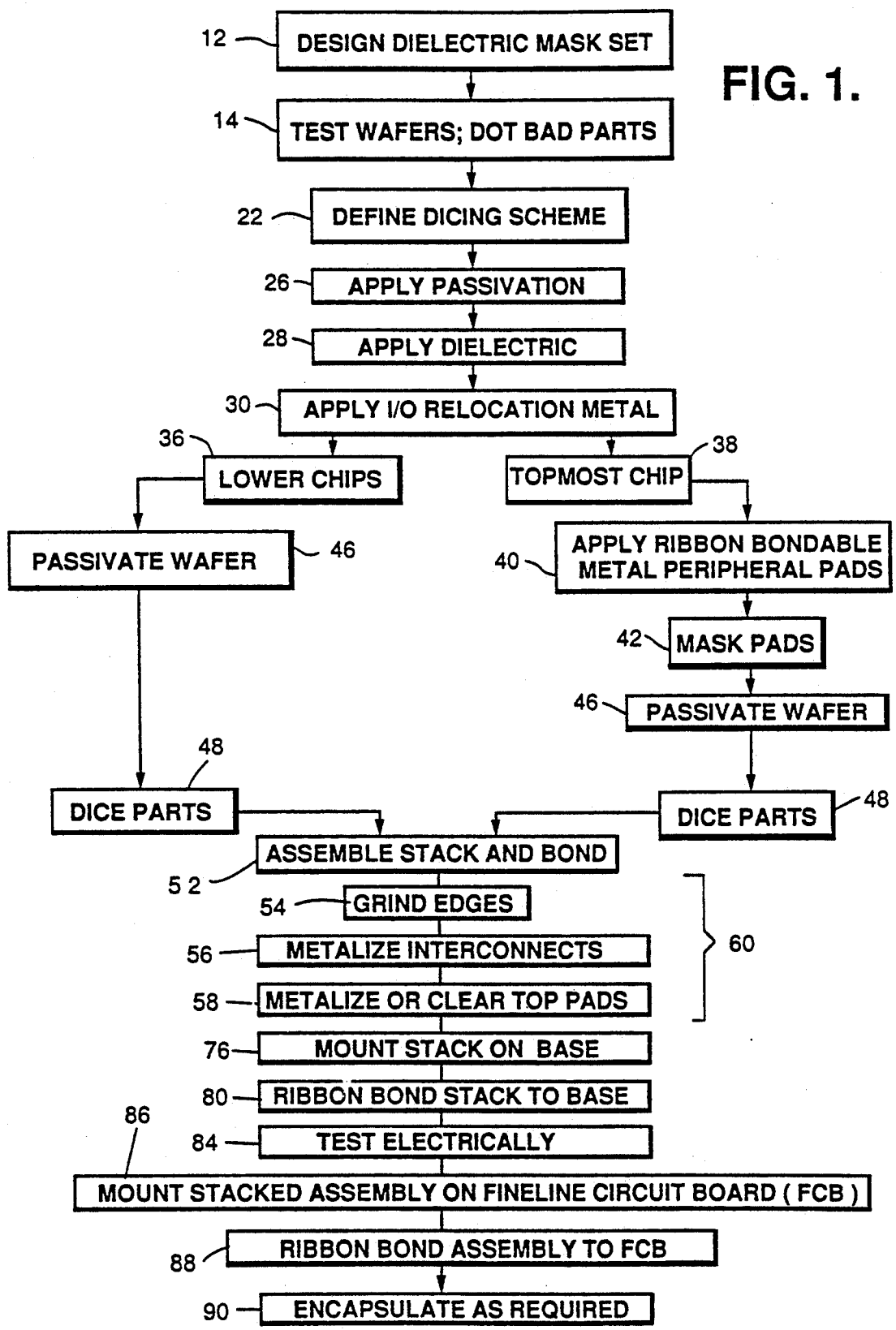
FIG. 1 is a flow diagram of a typical fabrication and assembly procedure for producing products encompassed by the present invention.
Figure 2:
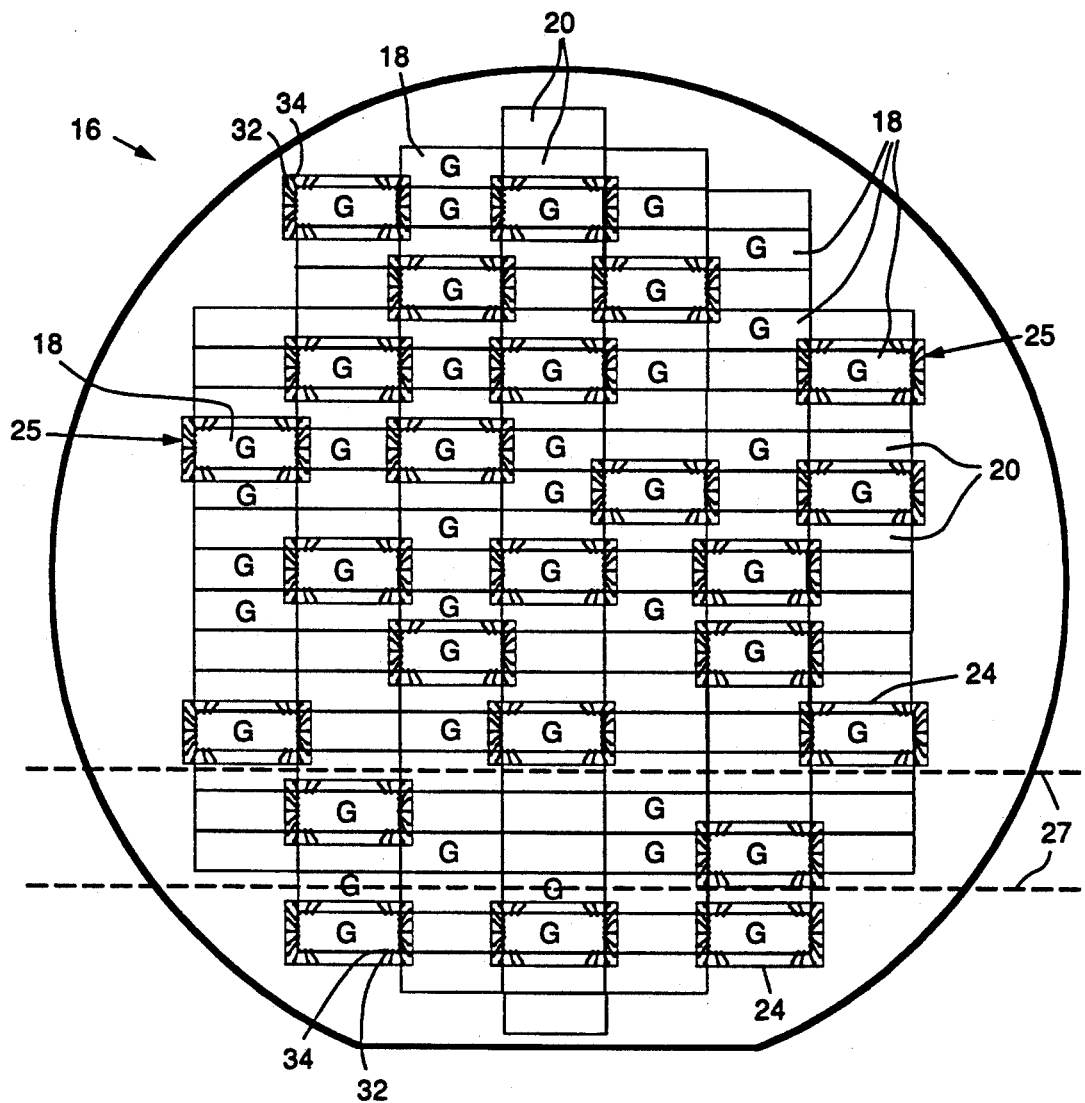
FIG. 2 is a representation of a typical full wafer which is modified to show a commencing step in the fabrication and assembly procedure of the present invention, using good circuits, designated "G", for incorporation into each chip whose size is greater than the good circuit which it incorporates.

Reference is first made to FIGS. 1 and 2, the former defining a flow diagram of the fabrication and assembly procedure of the present invention, and specifically to the steps designated by indicia 12 and 14. There, indicium 12 represents the method step where a set of dielectric masks is designed to define electrical connections based upon a desired electronic function or functions, and indicium 14 indicates the step in which a wafer 16 (see also FIG. 2) is tested by conventional methods to identify the locations on the wafer of good circuits 18 (also designated in FIG. 2 by indicium "G") and bad circuits 20. It is typical to dot the wafer where bad circuits are found, rather than to mark the good circuits with a "G" designation.

In conformance-with the present invention, a dicing scheme is defined for wafer 16 (step 22, FIG. 1), and defines locations 24 of oversized chips 25 which are to be diced from the wafer, as shown in FIG. 2. Dicing occurs preferably in two steps. First, the wafer is sawed, e.g., horizontally as shown by dashed lines 27, in such a manner as to avoid slicing through any oversized chip 25, and thus to separate the wafer into rows of chips 25, such as illustrated in FIG. 2. Then, each row is further sawed at a normal, i.e., vertically to the previously made horizontal saw lines 27, to form individual oversized chips 25.

In the dicing scheme of step 22 (FIG. 1), wherever possible to maximize use of the wafer material, locations 24 are selected to overlie bad circuits but, if necessary or unavoidable, over good circuits. As an important step in the present invention (step 26 of FIG. 1), the good circuits are masked to protect their input/output pads and wafer 16 is passivated with an impervious, inorganic coating to provide the necessary hermeticity of the chip circuitry. After further appropriate masking, dielectric material is applied to the wafer (step 28 of FIG. 1). This dielectric material may comprise a thin overcoat of organic resin. A pattern of input/output relocation metal is then applied to the wafer to define leads 32, and thus to extend input/output pads 34 of each chip shown in FIG. 2. The performance of this step is noted in step 30 of FIG. 1.

At this point, the processing of the wafer varies, depending upon whether the chips, which are to be diced from the wafer comprise lower or topmost chips. This variation in processing, as denoted in FIG. 1, is represented as diverging processing steps for lower chips 36 and topmost chips 38. Those chips 38, which are intended to function as top chips, require two additional processing steps 40 and 42. As depicted in step 40, ribbon bondable metal is applied to peripheral pads 34 (FIG. 2) and, as instructed in step 42, these pads are masked. If desired, wire leads may be used in place of ribbon leads, although the latter is preferred. As required by respective steps 46 and 48 for the lower and the top chips, the wafer is passivated, followed by a dicing of the wafer into lower and topmost chips.

As set forth in step 52, for each electric device, the lower chips and the topmost chip are stacked and bonded together into one of the assemblies illustrated in FIGS. 3-7.

Figure 3:
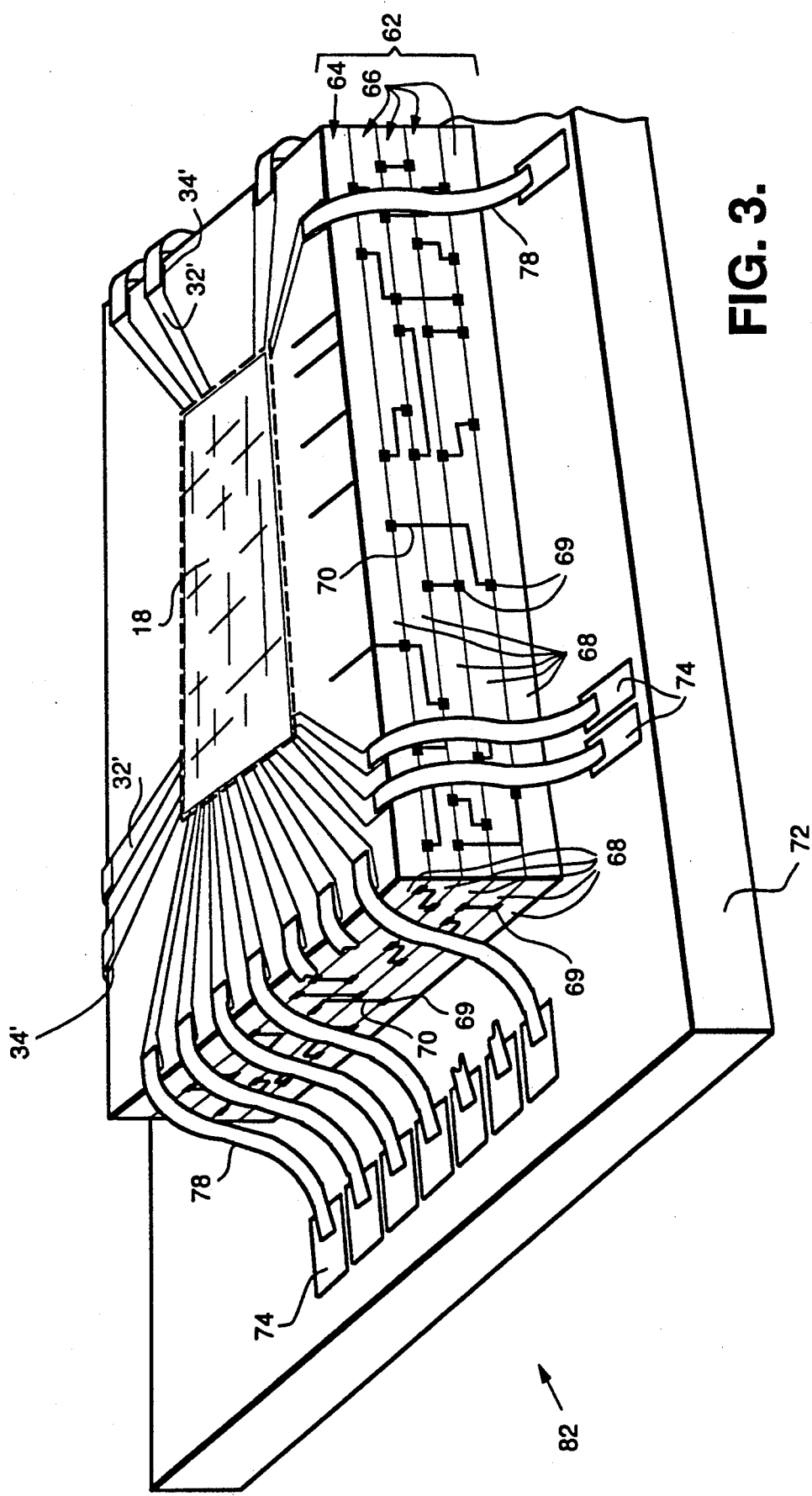
FIG. 3 illustrates one embodiment of the present invention comprising a stacked chip assembly before being mounted on a circuit substrate.

For only the embodiment disclosed in FIG. 3, the three steps identified in FIG. 1 by indicia 54, 56 and 58 and bracketed by indicium 60 are practiced to produce an assembly 62. In step 58, for example, as it is understood in the art, the term "clear" refers to the step of removing passivation from interconnection pads, if the entire wafer has been passivated in step 46 prior to its being diced, and the term "metalize" refers to the application of suitable metallurgy to facilitate ribbon bonding, if necessary.

Here, assembly 62 comprises a top chip 64 and lower chips 66 of equal planar dimensions. Top chip 64 comprises one of chips 25 shown in FIG. 2 which has been processed according to steps 38, 40, 42, 46 and 50 of FIG. 1 so that it includes leads 32' and terminal pads 34'. Lower chips 66, like top chip 64, comprise several of chips 25 of FIG. 2 which have been processed according to steps 36, 46 and 48 of FIG. 1 so that they include leads (not shown, but like leads 32 terminating in pads 34).

All of chips 64 and 66, after having been stacked and bonded together as subassembly 62, are ground at their respective edges 68 and on all sides on which connections are to be made, in order to ensure that all pads (e.g., pads 34' of topmost chip 64 and like pads on lower chips 66) are exposed and made flush in the planes of their respective sides, in accordance with step 54 of FIG. 1. Because it is desirable to increase the amount of metal of the exposed pads on lower chips 66, metalization 69 is added to these exposed pads. Interconnects 70 are then formed by conventional metalization techniques between or among selected pads (e.g., pads 34') and metalization 69 and, further, top pads 34' are metalized or cleared, as required by the electrical function, pursuant to steps 56 and 58.

Stacked and bonded subassembly 62 is then mounted on and affixed to a base 72, having pads 74, as required by step 76, and ribbon leads 78 are bonded respectively to pads 34' and to pads 74, as represented by step 80, to form an assembly 82.

Assembly 82 is then electrically tested according to step 84 to determine if its electrical function operates as intended. Should the test prove successful, assembly 82 is then mounted on and ribbon bonded to a fineline or other appropriate circuit board in accordance with steps 86 and 88. If the test is not successful, assembly 82 is returned for further processing or discarded, as appropriate. Successfully tested constructions are then encapsulated, if needed, as noted by step 90.

Assemblies 92, 94, 96 and 98, respectively shown in FIGS. 4-7, are also processed in accordance with the steps depicted in FIG. 1, except for steps 54, 56 and 58 thereof.

Figure 4:
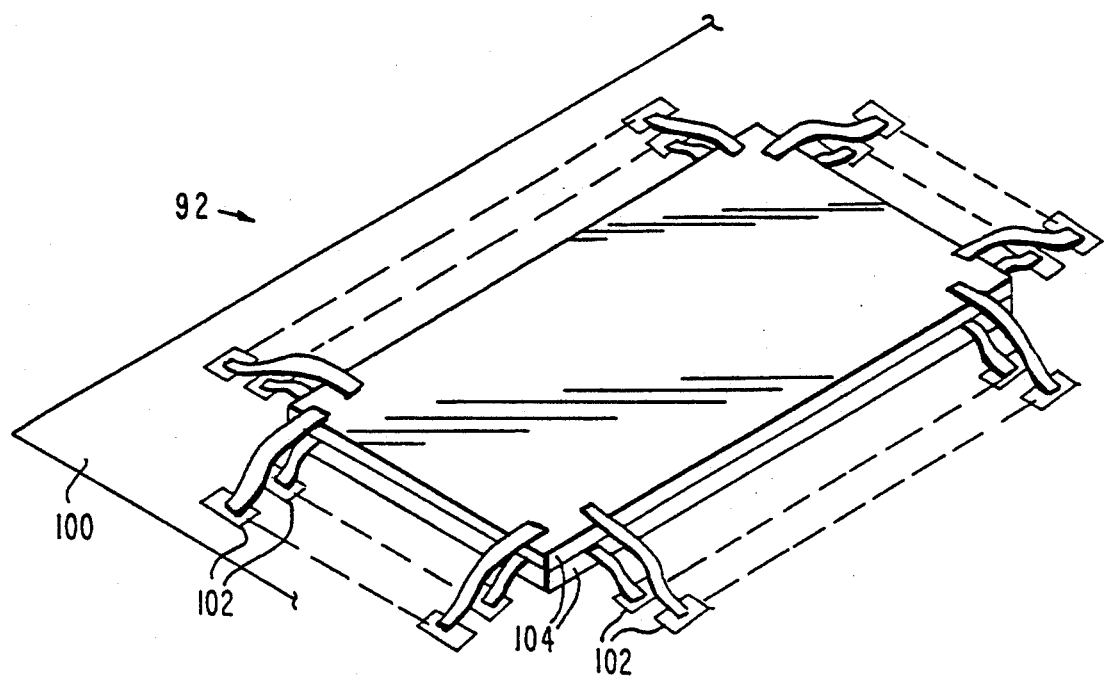
FIGS. 4–7 depict other embodiments of the present invention, showing alternate construction methods which have been devised to meet special requirements for mounting memory and other chips on a circuit substrate or a printed-wiring board.

In the method for fabricating assembly 92 of FIG. 4, a substrate circuit 100 is provided with sufficient pads 102 to permit direct connection to the circuit of individual chips 104 which are stacked upon one another. No connections are made between the chips, but the chips can use selected pads in common on the substrate circuit. This technique permits a more conventional assembly to be made using existing processes, and does not require the development of new technologies or interconnecting chips on their vertical edges as shown in FIG. 3.

Figure 5:
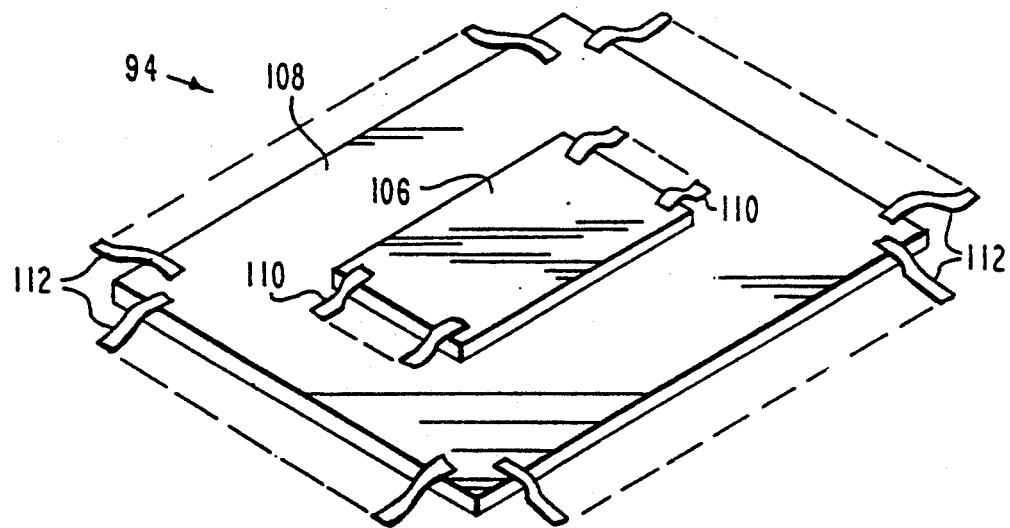

As disclosed with respect to assembly 94 of FIG. 5, in those cases where it is desirable to mount a chip 106 in very close proximity to another chip 108, one expedient method is to mount chip 106 atop chip 108, and to interconnect upper chip 106 directly to lower chip 108 without the necessity of interconnections being made to a substrate as an intermediary circuit path. To accomplish this, it is necessary that upper chip 106 be smaller than lower chip 108, so as to provide room for pads on the lower chip to accommodate interconnecting wires or ribbons 110 from the upper chip. Assembly 94 is then mounted and electrically coupled to a substrate (not shown) by groups of ribbon leads 112.

Figure 6:
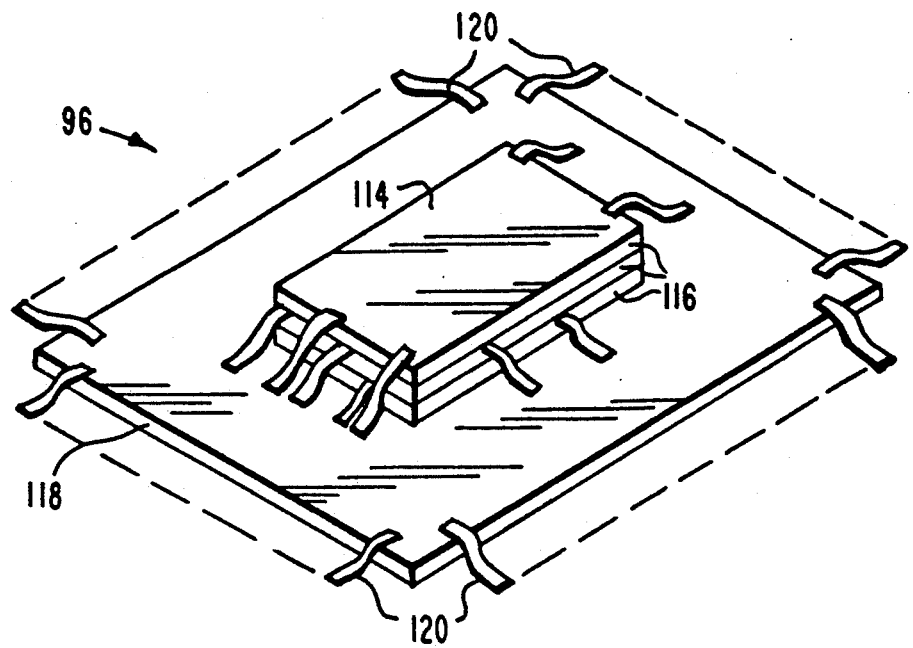

As illustrated in FIG. 6, it is possible also to mount several chips in a stack 114, like chips 104 shown in FIG. 4, where a group of upper chips 116 are smaller than chip 118 below, to permit accommodation of interconnecting pads on the lowest chip for all of the uppermost chips. The lowest chip has pads at its periphery to permit its connection by ribbon leads 120 to a substrate (not shown).

Figure 7:
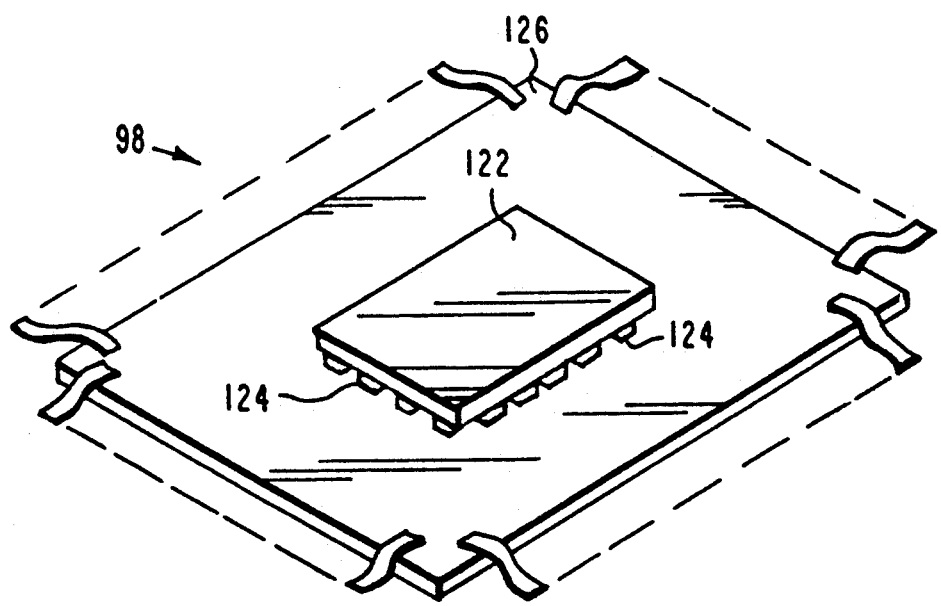

Yet another method is shown in FIG. 7 where an upper chip 122 is flip-chip mounted with bump pads 124 to a lower chip 126. Here, the matched coefficient of thermal expansion of silicon on silicon can be used to advantage.

Although the invention has been described with respect to particular embodiments thereof, it should be realized that various changes and modifications may be made therein without departing from the spirit and scope of the invention.

What is claimed is:

1. An assembly of chips comprising:
   at least two integrated circuit chips stacked one atop the other, assembled parallelly on a base, and electrically interconnected to said base; and
   means for forming each of said chips from a wafer having a plurality of circuits thereon in which wafer portions are selected by individual chip sizes which are respectively larger than individual ones of said circuits and in which individual ones of said chips are positioned on selected operable ones of said circuits, thus overlapping said chips onto ones of said circuits adjacent said selected circuits.

2. The assembly according to claim 1 in which each of said chips are provided with edge electrical contacts extending fully about its periphery, further comprising electrical interconnections among and between said edge electrical contact of each of said chips for electrically interconnecting said chips together.

3. The assembly according to claim 2 further comprising electrical connections extending from an uppermost one of said chips to said base.

4. The assembly according to claim 2 in which said stacked chips have equal dimensions, said electrical interconnection among said chips are positioned at the edges of said chips, and electrical interconnections between the uppermost chip and said base.

5. The assembly according to claim 2 in which said stacked chips have unequal dimensions, with at least one of those chips having lesser dimensions being stacked atop at least another of those chips having relatively larger dimension, and further comprising electrical interconnections between successive ones of said upper chips to said lower chips and hence to said base.

* * * * *